(12) United States Patent
Sakai

(10) Patent No.: US 8,716,137 B2
(45) Date of Patent: May 6, 2014

(54) METHOD FOR ETCHING POLYCRYSTALLINE SILICON, METHOD FOR MANUFACTURING SEMICONDUCTOR DEVICE, AND ETCHING PROGRAM

(75) Inventor: Takayuki Sakai, Ishikawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 55 days.

(21) Appl. No.: 13/600,081

(22) Filed: Aug. 30, 2012

(65) Prior Publication Data
US 2013/0210204 A1    Aug. 15, 2013

(30) Foreign Application Priority Data

Feb. 15, 2012    (JP) .................. 2012-030380

(51) Int. Cl.
*H01L 21/00*    (2006.01)
(52) U.S. Cl.
USPC .......................................... 438/700; 438/719
(58) Field of Classification Search
USPC .................. 438/719, 735, 742, 700
See application file for complete search history.

(56) References Cited

FOREIGN PATENT DOCUMENTS

| JP | 04-102319 | 4/1992 |
|---|---|---|
| JP | 2000-349289 | 12/2000 |
| JP | 2004-235247 | 8/2004 |
| JP | 2004-253576 | 9/2004 |
| JP | 2007-311547 | 11/2007 |
| JP | 4127064 | 7/2008 |
| JP | 2010-141028 | 6/2010 |
| JP | 4561114 | 10/2010 |

*Primary Examiner* — Richard Booth
(74) *Attorney, Agent, or Firm* — Patterson & Sheridan, LLP

(57) ABSTRACT

According to an embodiment, a method for etching polycrystalline silicon includes a step of holding the polycrystalline silicon at a temperature higher than or equal to $T_E$ (K) given in a following equation; and a step of etching the polycrystalline silicon by dry etching with an etching gas containing $CF_4$ and $O_2$, $$T_E = \frac{-0.114x + 0.0556}{k \times \ln\left\{(1 - r/d) \times \frac{-6.27x + 5.38}{-2.01x + 3.11}\right\}}$$

where d (nm) is etching amount of the polycrystalline silicon, r (nm) is surface roughness of the polycrystalline silicon after the etching, x is ratio of flow rate of $CF_4$ gas to sum of flow rate of the $CF_4$ gas and flow rate of $O_2$ gas, and k (eV/K) is Boltzmann constant.

14 Claims, 8 Drawing Sheets

METHOD FOR ETCHING POLYCRYSTALLINE SILICON, METHOD FOR MANUFACTURING SEMICONDUCTOR DEVICE, AND ETCHING PROGRAM

CROSS-REFERENCE TO RELATED APPLICATIONS

This application is based upon and claims the benefit of priority from Japanese Patent Application No. 2012-030380, filed on Feb. 15, 2012; the entire contents of which are incorporated herein by reference.

FIELD

Embodiments are generally related to a method for etching polycrystalline silicon, a method for manufacturing a semiconductor device and an etching program.

BACKGROUND

Polycrystalline silicon is used in wide applications such as semiconductor elements, LCD (liquid crystal displays), and MEMS (microelectromechanical systems). For example, polycrystalline silicon is used for the gate electrode of MOS-FET (metal oxide semiconductor field effect transistor), and a technique for uniformly processing polycrystalline silicon is required to miniaturize the semiconductor elements. Because the surface roughness of the polycrystalline silicon close to the crystal grain size thereof affects the characteristics of semiconductor elements, and decrease the manufacturing yield.

DETAILED DESCRIPTION

Figure 1A:
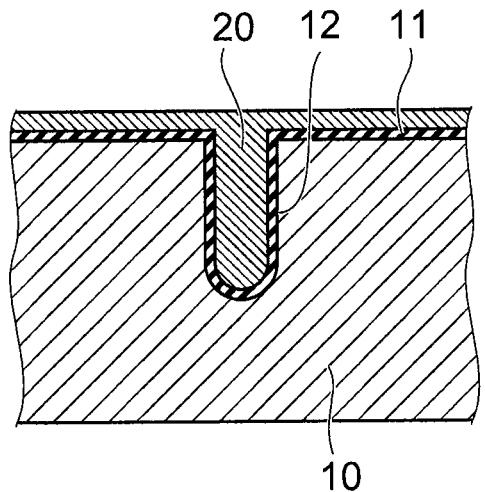
FIGS. 1A and 1B are schematic sectional views illustrating an etching process of polycrystalline silicon according to a first embodiment.

According to an embodiment, a method for etching polycrystalline silicon includes a step of holding the polycrystalline silicon at a temperature higher than or equal to $T_E$ (K) given in a following equation; and a step of etching the polycrystalline silicon by dry etching with an etching gas containing $CF_4$ and $O_2$, $$T_E = \frac{-0.114x + 0.0556}{k \times \ln\left\{(1 - r/d) \times \frac{-6.27x + 5.38}{-2.01x + 3.11}\right\}}$$

where d (nm) is etching amount of the polycrystalline silicon, r (nm) is surface roughness of the polycrystalline silicon after the etching, x is ratio of flow rate of $CF_4$ gas to sum of flow rate of the $CF_4$ gas and flow rate of $O_2$ gas, and k (eV/K) is Boltzmann constant.

Embodiments of the invention will now be described with reference to the drawings. Same portions in the drawings are labeled with the same reference numerals, with the detailed description thereof omitted appropriately, and the different portions are described.

First Embodiment

Figure 1B:
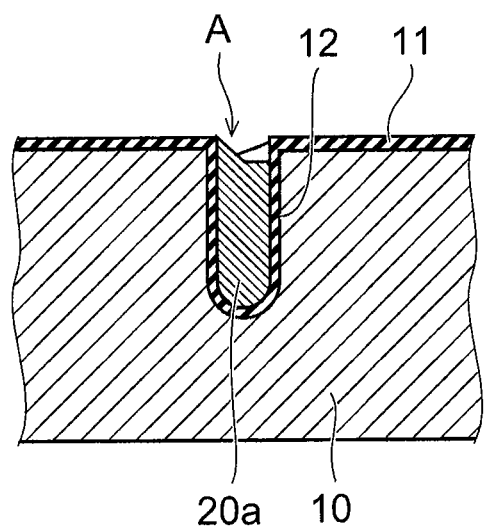

FIGS. 1A and 1B are schematic sectional views showing an etching process of polycrystalline silicon according to a first embodiment.

As shown in FIG. 1A, a polycrystalline silicon layer 20 is formed on a substrate 10. The substrate 10 is e.g. a silicon wafer. The substrate 10 includes a depression 12 such as trench and recess. The polycrystalline silicon layer 20 can be formed using e.g. the CVD (chemical vapor deposition) method. An insulating film 11 such as silicon oxide film may be interposed between the substrate 10 and the polycrystalline silicon layer 20.

Next, the polycrystalline silicon layer 20 is held at a temperature higher than or equal to $T_E$ (K) given in the following equation (1), and etched by the dry etching method. The etching gas contains carbon tetrafluoride ($CF_4$) and oxygen ($O_2$).

$$T_E = \frac{-0.114x + 0.0556}{k \times \ln\left\{(1 - r/d) \times \frac{-6.27x + 5.38}{-2.01x + 3.11}\right\}} \quad (1)$$

Here, d (nanometer, nm) is the etching amount of polycrystalline silicon, r (nm) is the surface roughness of the polycrystalline silicon layer after the etching, x is the ratio of the flow rate of $CF_4$ gas to the sum of the flow rate of $CF_4$ gas and the flow rate of $O_2$ gas, and k (eV/K) is the Boltzmann constant.

For instance, d is the target etching amount of the polycrystalline silicon layer 20, and r is the allowable value of the surface roughness.

The dry etching is performed under an isotropic etching condition. The isotropic etching condition means that the etching rate is isotropic. The isotropic etching condition is a condition in which chemical reactions are dominant. For instance, the CDE (chemical dry etching) method can be used for the etching.

As shown in FIG. 1B, a portion 20a of the polycrystalline silicon layer 20 is left in the depression 12 of the substrate 10, and the polycrystalline silicon layer 20 provided above the substrate 10 is removed in the etching method according to this embodiment.

For instance, the width of the opening A of the depression 12 may be comparable to the average grain diameter of the crystal grain in the polycrystalline silicon layer 20. Then, the surface roughness of the polycrystalline silicon 20a left in the depression 12 is often made non-negligible in such a case. The average grain diameter of polycrystalline silicon may be approximately 100 nm. Then, it is difficult to flatten the surface of the polycrystalline silicon layer 20 buried in the trench that has an opening width of 200-500 nm.

For instance, the CDE etching condition is set as follows: Flow rate of $CF_4$ 150 sccm, flow rate of $O_2$ 60 sccm, pressure 40 Pa, and microwave power 700 W. Etching is performed at room temperature (25° C.). Then, the polycrystalline silicon layer 20 has large roughness at the etching surface. Thus, the so-called surface roughening occurs. This is attributable to the difference in etching rate depending on the orientation of crystal grains (surface orientation) of the polycrystalline silicon layer.

Figure 2:
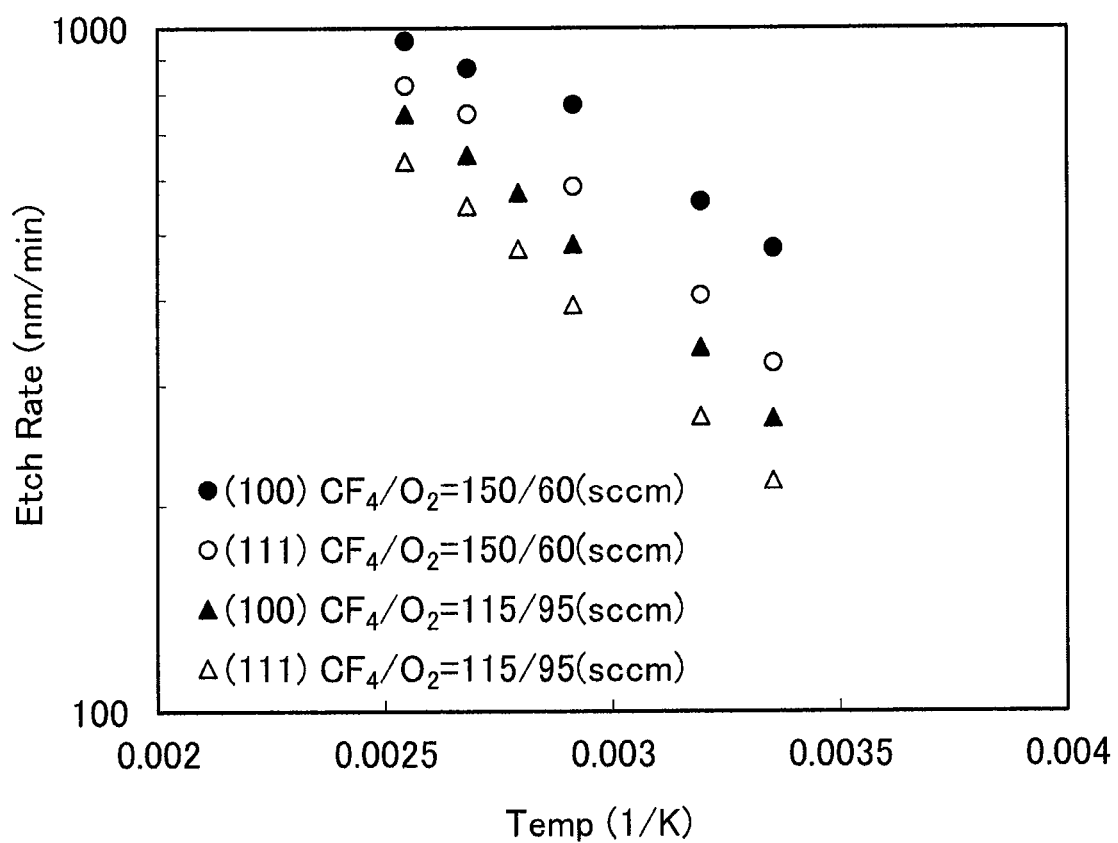
FIG. 2 is a graph showing a temperature dependence of etching rates of silicon.

FIG. 2 is a graph showing the temperature dependence of etching rates of silicon. The vertical axis represents the etching rate of monocrystalline silicon. The horizontal axis represents the inverse of etching temperature. The graph shows the etching rates of (100) surface and (111) surface.

The data were obtained by etching a silicon wafer cut along the (100) surface and (111) surface using the CDE method. The etching gas, flow rate of CDE is set by the following two conditions: $CF_4$ flow rate 150 sccm and $O_2$ flow rate 60 sccm, and $CF_4$ flow rate 115 sccm and $O_2$ flow rate 95 sccm.

As shown in FIG. 2, the silicon etching rate becomes faster as the temperature increases. The etching rate at the (111) surface is slower than the etching rate at the (100) surface. Furthermore, the etching rate decreases as the flow rate of $CF_4$ becomes lower. By approximating these results using the Arrhenius equation $A \times \exp(-E_A/kT)$, the following relations (2) to (5) can be obtained.

In the case of $CF_4$ flow rate 150 sccm and $O_2$ flow rate 60 sccm:

$$ER_{100} = 9.04 \times 10^3 \times \exp(-7.49 \times 10^{-2}/kT) \tag{2}$$

$$ER_{111} = 1.68 \times 10^4 \times \exp(-1.01 \times 10^{-1}/kT) \tag{3}$$

In the case of $CF_4$ flow rate 115 sccm and $O_2$ flow rate 95 sccm:

$$ER_{100} = 1.95 \times 10^4 \times \exp(-1.10 \times 10^{-1}/kT) \tag{4}$$

$$ER_{111} = 2.01 \times 10^4 \times \exp(-1.16 \times 10^{-1}/kT) \tag{5}$$

Here, ER (nm/min) is the etching rate, and its subscript indicates the surface orientation. T (K) is the etching temperature, and k is the Boltzmann constant.

Figure 3:
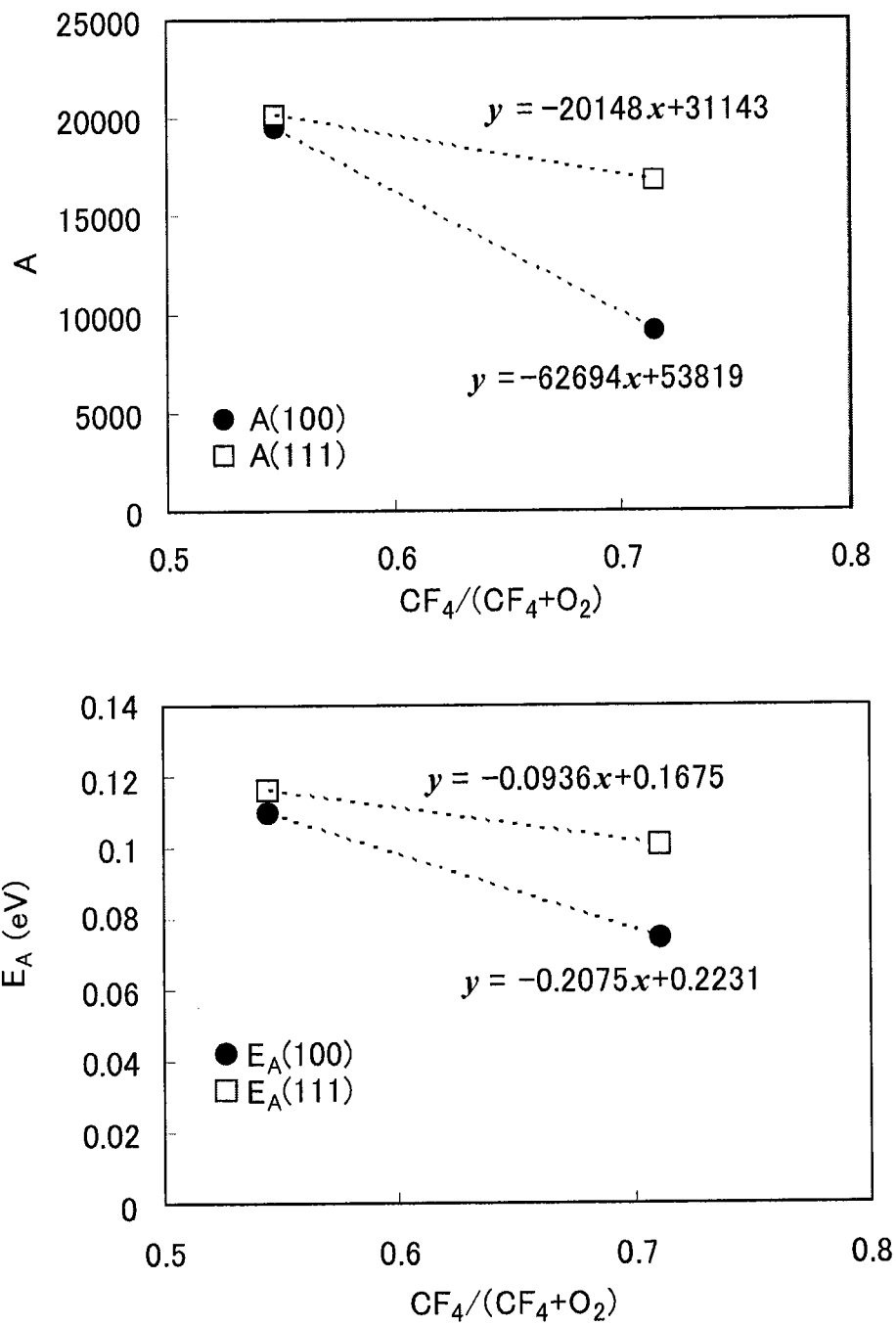
FIG. 3 is a graph showing etching properties of silicon.

FIG. 3 is a graph showing the coefficient A and the activation energy $E_A$ (eV) of the Arrhenius equation versus the flow rate of $CF_4$. The horizontal axis represents the ratio x of the flow rate of $CF_4$ to the sum of the flow rate of $CF_4$ and the flow rate of $O_2$.

By linear approximation of the data in the condition of $CF_4$ flow rate 150 sccm and $O_2$ flow rate 60 sccm, and the data in the condition of $CF_4$ flow rate 115 sccm and $O_2$ flow rate 95 sccm, the following relations (6) to (9) can be obtained.

$$A_{100} = -6.27 \times 10^4 x + 5.38 \times 10^4 \tag{6}$$

$$A_{111} = -2.01 \times 10^4 x + 3.11 \times 10^4 \tag{7}$$

$$E_{A100} = -2.08 \times 10^{-1} x + 2.23 \times 10^{-1} \tag{8}$$

$$E_{A111} = -9.36 \times 10^{-2} x + 1.68 \times 10^{-1} \tag{9}$$

Here, the subscripts of A and $E_A$ represent the (100) surface and the (111) surface.

From these relations, the etching rates $ER_{100}$ and $ER_{111}$ of the (100) surface and the (111) surface can be represented by the following equations (10) and (11).

$$ER_{100} = A_{100} \times \exp(-E_{A100}/kT) \tag{10}$$

$$ER_{111} = A_{111} \times \exp(-E_{A111}/kT) \tag{11}$$

For instance, the etching amount of the (100) surface is denoted by d (nm). Then, the etching amount difference $\Delta d_E$ in etching the (111) surface under the same condition is represented by the following equation (12).

$$\Delta d_E = d \times (ER_{100} - ER_{111})/ER_{100} \tag{12}$$

In the etching of the polycrystalline silicon layer 20, this etching amount difference $\Delta d_E$ corresponds to the magnitude of the surface roughening. As $\Delta d_E$ becomes smaller, a flatter etching surface is obtained.

For instance, let $\Delta d_E$ be the roughness of the etching surface of the polycrystalline silicon layer 20, and let r be its allowable value. Then, it is only necessary to satisfy the following formula (13).

$$d \times (ER_{100} - ER_{111})/ER_{100} < r \tag{13}$$

Furthermore, by substituting equations (10) and (11) into the formula (13), the allowable range of the etching temperature can be determined.

$$T_E > \frac{-(E_{A111} - E_{A100})}{k \times \ln\left\{(1 - r/d) \times \frac{A_{100}}{A_{111}}\right\}} \tag{14}$$

Then, by substituting equations (6) to (9) into the formula (14), the following formula (15) is obtained.

$$T_E > \frac{-0.114x + 0.0556}{k \times \ln\left\{(1 - r/d) \times \frac{-6.27 \times 10^4 x + 5.38 \times 10^4}{-2.01 \times 10^4 x + 3.11 \times 10^4}\right\}} \tag{15}$$

That is, etching the polycrystalline silicon layer 20 under the temperature condition satisfying formula (15) makes the roughness of the etching surface smaller than r.

Figure 4:
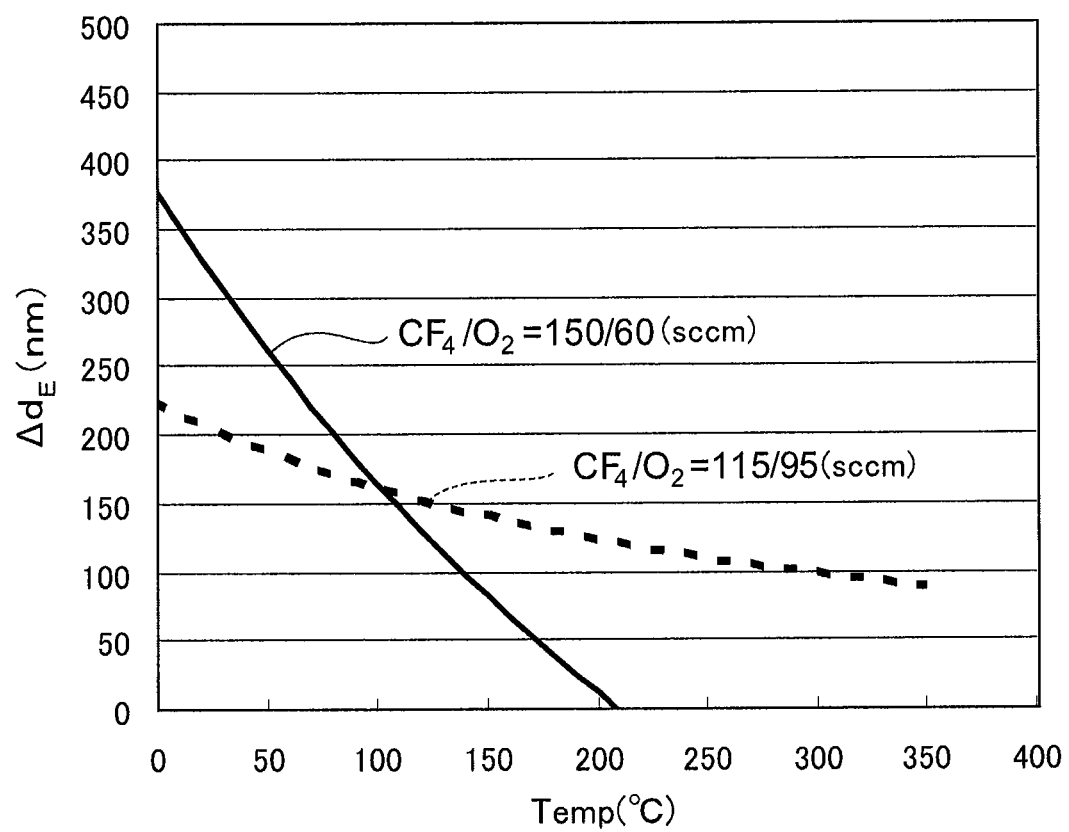
FIG. 4 is a graph showing a temperature dependence of the etching amount of silicon.

FIG. 4 is a graph showing the temperature dependence of the etching amount difference $\Delta d_E$ under the etching condition where the (100) surface is etched by 1 micrometer (μm). The graph shows the difference $\Delta d_E$ between the etching amounts of the (111) surface and the (100) surface versus the etching temperature Temp (° C.).

For instance, $\Delta d_E$ can be set to 100 nm or less by setting the etching temperature to 140° C. or more in the case where $CF_4$ flow rate is 150 sccm and $O_2$ flow rate is 60 sccm. $\Delta d_E$ can be set to 100 nm or less by setting the etching temperature to 300° C. or more in the case where $CF_4$ flow rate is 115 sccm and $O_2$ flow rate is 95 sccm.

Thus, it is possible to reduce the surface roughness by carrying out the dry etching while the polycrystalline silicon layer 20 is held at an etching temperature satisfying equation (1). In the example illustrated in the above embodiment, the polycrystalline silicon is buried in the depression 12 of the substrate 10. However, the embodiment is not limited thereto. For instance, the embodiment is also applicable to the case where an interconnection is formed on the substrate surface. The embodiment is more effective in the case of fine processing closer to the average grain diameter of polycrystalline silicon.

Second Embodiment

A method for manufacturing a semiconductor device 100 according to a second embodiment is described with reference to FIGS. 5A to 6B. FIGS. 5A to 6B are schematic sectional views showing a manufacturing process of the semiconductor device 100. The semiconductor device 100 is e.g. a power MOSFET with a trench gate structure.

Figure 5A:
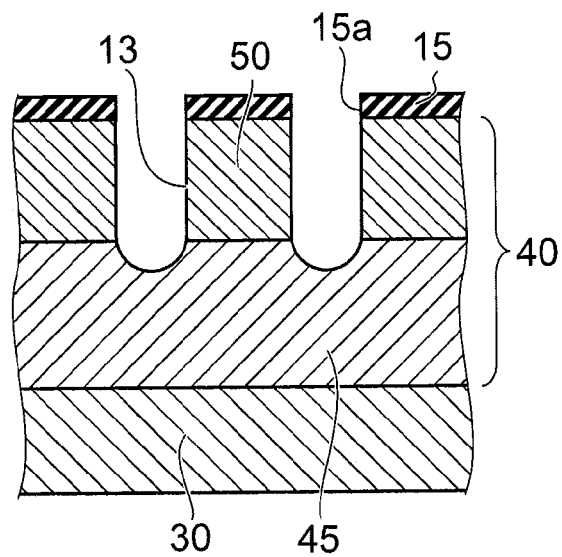
FIGS. 5A to 6B are schematic sectional views showing a manufacturing process of a semiconductor device according to a second embodiment.

As shown in FIG. 5A, a trench 13 is formed in an n-type semiconductor layer 40 of low carrier concentration provided on an $n^+$-drain layer 30.

The n⁺-drain layer 30 is e.g. an n-type silicon layer epitaxially grown on a silicon substrate with a high impurity concentration. Alternatively, the silicon substrate may constitute the n⁺-drain layer 30. Then, an n-type silicon layer being the semiconductor layer 40 is epitaxially grown on the n⁺-drain layer 30. Furthermore, p-type impurity is ion implanted into the upper surface of the semiconductor layer 40 to form a p-type base region 50. Thus, an n-type drift region 45 is formed between the p-type base region 50 and the n⁺-drain layer 30.

Next, a silicon oxide film 15 is formed on the surface of the p-type base region 50. In part of the silicon oxide film 15, an opening 15a is formed by photolithography. Then, the silicon oxide film 15 is used as an etching mask for etching the semiconductor layer 40. Thus, a trench 13 is formed penetrating through the p-type base region 50 to the n-type drift region 45. The etching of the semiconductor layer 40 is performed using e.g. RIE (reactive ion etching). The width of the opening of the trench 13 is e.g. 300 nm.

Figure 5B:
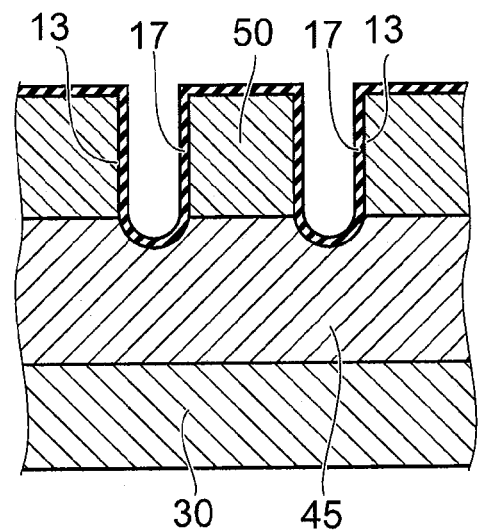

Next, as shown in FIG. 5B, the silicon oxide film 15 is removed by wet etching. Then, a gate insulating film 17 is formed on the inner surface of the trench 13. The gate insulating film 17 is formed e.g. thermally oxidizing the inner surface of the trench 13.

Figure 5C:
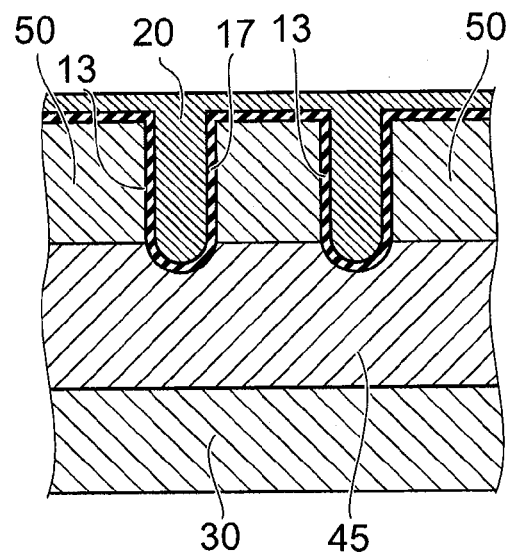

Next, a polycrystalline silicon layer 20 buried inside the trench 13 is formed as shown in FIG. 5C. The polycrystalline silicon layer 20 is deposited using e.g. the CVD method. The polycrystalline silicon layer 20 is formed inside the trench 13 and on the gate insulating film 17 formed on the surface of the p-type base region 50.

Figure 6A:
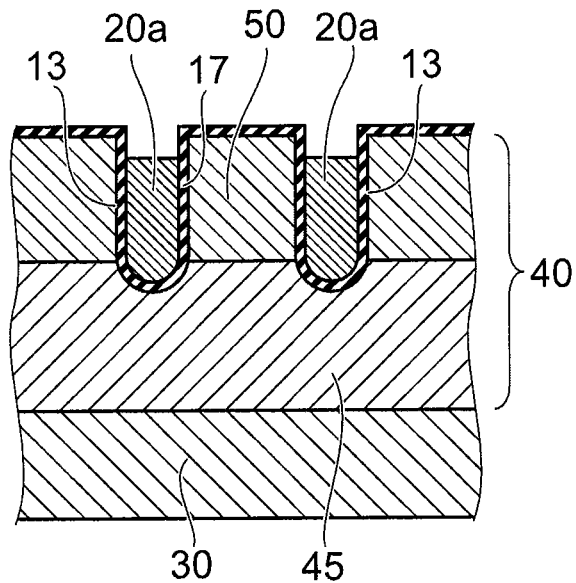

Next, the polycrystalline silicon layer 20 above the semiconductor layer 40 is removed, leaving a portion 20a inside the trench 13 as shown in FIG. 6A.

The polycrystalline silicon layer 20 is etched using e.g. the CDE method. During the etching, the polycrystalline silicon layer 20 is held at an etching temperature higher than or equal to $T_E$(K) satisfying equation (1), and etched using an etching gas containing $CF_4$ and $O_2$.

Figure 6B:
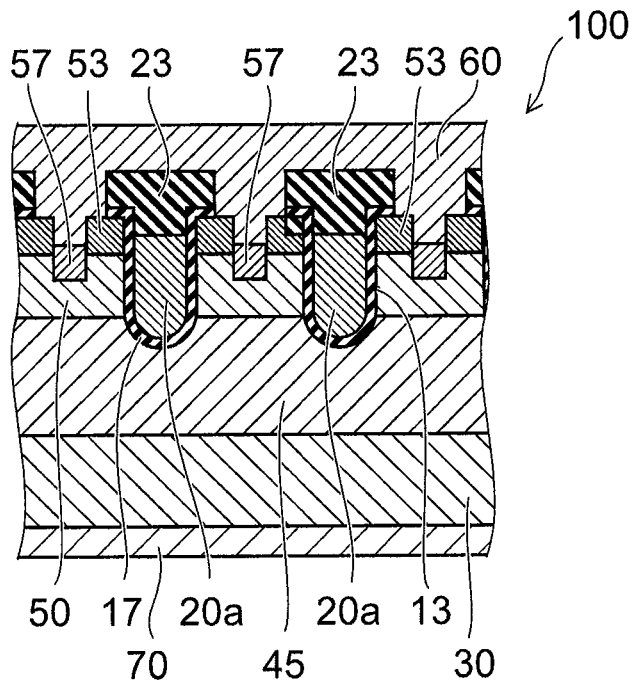

Next, as shown in FIG. 6B, an n-type source region 53 and a p-type contact region 57 are selectively formed in the surface of the p-type base region 50. Next, an interlayer insulating film 23 is formed on the portion 20a of the polycrystalline silicon layer 20 left inside the trench 13. Furthermore, a source electrode 60 is formed to be electrically connected to the n-type source region 53 and the p-type contact region 57, and to cover the interlayer insulating film 23. Then, a drain electrode 70 is formed to be electrically connected to the n⁺-drain layer 30. Thus, the semiconductor device 100 is completed.

In the semiconductor device 100, the polycrystalline silicon 20a left inside the trench 13 serves as a gate electrode and forms a channel at the interface between the gate insulating film 17 and the p-type base region 50. The surface of the polycrystalline silicon 20a can be made flat using the etching method according to the embodiment. This can reduce variations in the recess amount of polycrystalline silicon in the upper portion of the trench 13. Thus, the channel length can be controlled to be short, and the on-resistance can be reduced.

Furthermore, because the surface of the polycrystalline silicon 20a is made flat, no polycrystalline silicon is left on the shoulder of the opening of the trench 13. This can suppress short circuit failure between the gate and the source. Thus, the reliability of the semiconductor device 100 can be improved.

Third Embodiment

Figure 7:
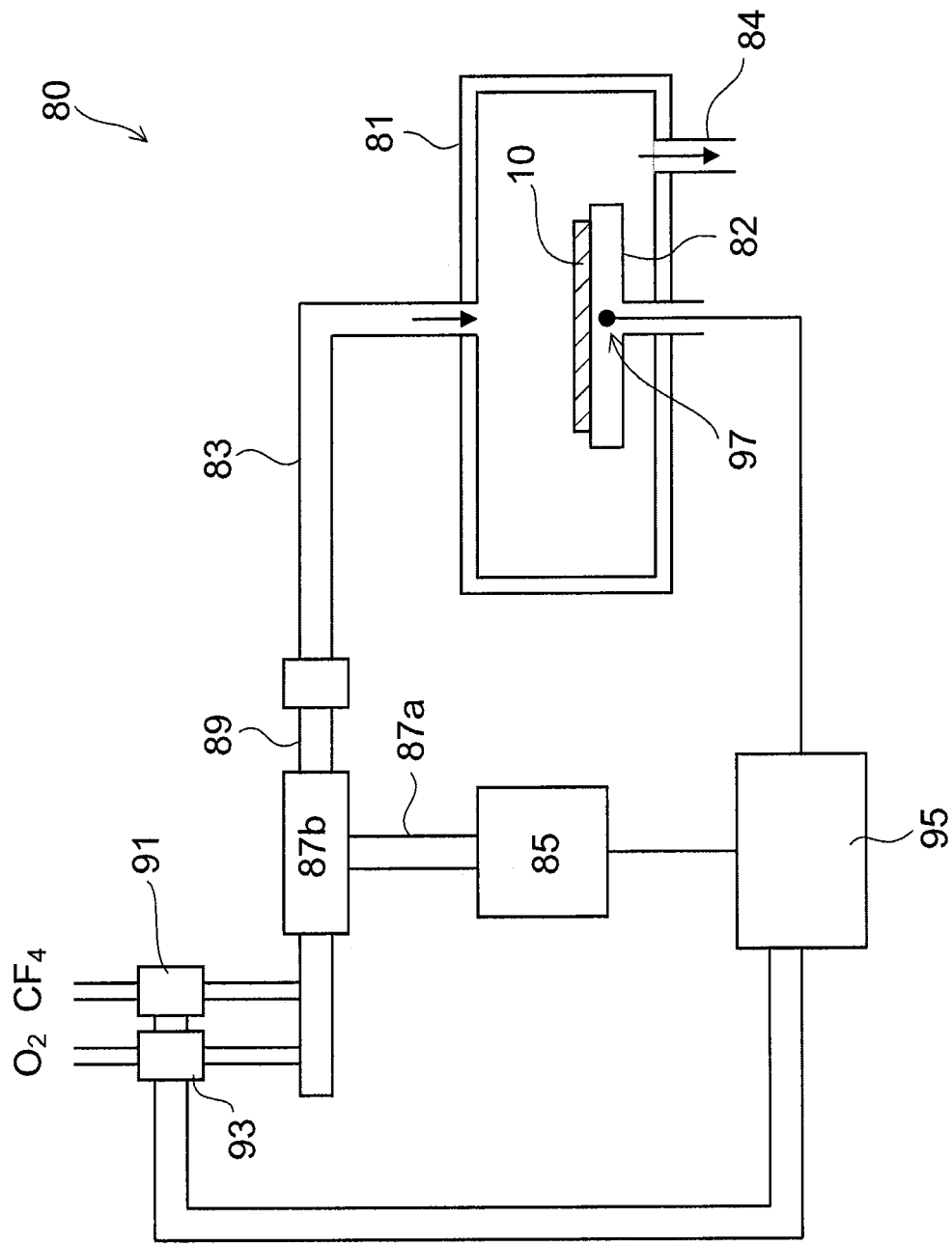
FIG. 7 is a schematic view illustrating the etching apparatus according to a third embodiment.
Figure 8:
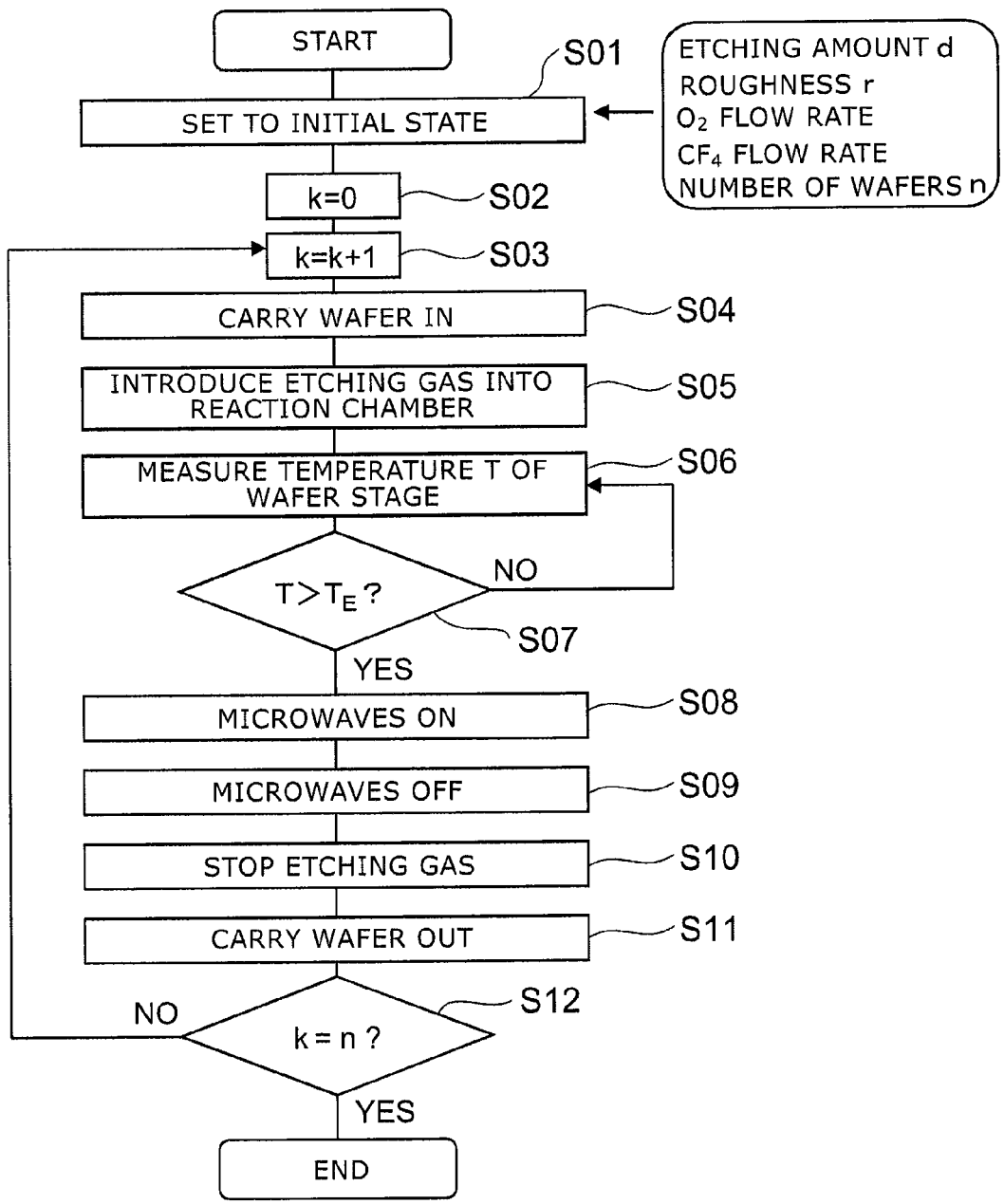
FIG. 8 is a flow chart showing a sequence of the etching apparatus according to the third embodiment.

Next, a polycrystalline silicon etching apparatus 80 and its operation are described with reference to FIGS. 7 and 8. FIG. 7 is a schematic view illustrating the etching apparatus 80. FIG. 8 is a flow chart showing the sequence of the etching apparatus 80.

The etching apparatus 80 is e.g. a CDE apparatus. The dry etching apparatus 80 includes a reaction chamber 81, a microwave oscillator 85, a discharge tube 89, and a controller 95 as shown in FIG. 7.

A stage 82 for mounting a substrate 10 (wafer) is provided inside the reaction chamber 81. For instance, a heater, not shown, is embedded in the stage 82. The controller 95 detects the temperature of the stage 82 by a temperature sensor 97. The controller 95 holds the substrate 10 at a prescribed temperature by controlling the heater.

The microwave oscillator 85 supplies microwaves to an electrode 87b through a waveguide 87a and generates plasma inside the discharge tube 89. The discharge tube 89 is supplied with $CF_4$ and $O_2$ flow-controlled by mass flow controllers (MFC) 91 and 93.

$CF_4$ and $O_2$ introduced into the discharge tube 89 are excited to a plasma state including fluorine radicals and oxygen radicals by microwaves. Then, through a transport pipe 83 connected to the discharge tube 89, fluorine radicals and oxygen radicals are supplied to the reaction chamber 81. Thus, the substrate 10 is etched.

The controller 95 is e.g. a microprocessor or sequencer. The controller 95 controls the microwave oscillator 85 and MFC 91 and 93 to etch the substrate 10. The controller 95 stores e.g. a program describing the sequence shown in FIG. 8.

As shown in FIG. 8, the controller 95 first sets the etching apparatus 80 to an initial state (step S01). For instance, the etching amount d, the allowable value of roughness r, the $O_2$ flow rate, and the $CF_4$ flow rate are inputted to the controller 95 and used to calculate the etching temperature $T_E$ (see equation (1)). The temperature of the stage 82 is held at a temperature $T_S$ higher than $T_E$. The temperature difference between $T_E$ and $T_S$ is set previously. Furthermore, the flow rates of the MFC 91 and 93 are also set previously.

Next, the counter for the processed number is initialized (steps S02, S03). The number of processed wafers n is inputted to the controller 95.

Next, for instance, a wafer is taken out of a wafer holder set to a load lock mechanism (not shown), and carried into the reaction chamber 81 (step S04).

Next, an etching gas is introduced into the reaction chamber 81 (step S05). Specifically, the MFC 91 and 93 are turned on. Through the discharge tube 89 and the transport pipe 83, $O_2$ and $CF_4$ are caused to flow into the reaction chamber 81 at prescribed flow rates. At this time, the pressure inside the reaction chamber 81 is reduced to a prescribed pressure by a vacuum pump connected to an evacuation port 84.

Next, the temperature sensor 97 detects the temperature of the stage 82, on which the substrate 10 is mounted (step S06). If the stage temperature is higher than the etching temperature $T_E$ (step S07), the microwave oscillator 85 is operated to generate a microwave plasma inside the discharge tube 89 (step S08). On the other hand, if the stage temperature is lower than the etching temperature $T_E$, the stage temperature is increased using the heater (S07 to S06).

Next, the microwave oscillator 85 is stopped after the lapse of a prescribed discharge time of the microwave plasma (step S09). The discharge time of the microwave plasma is determined based on the etching amount d. For instance, a lookup table may be stored in the controller 95, or the discharge time may be externally inputted to the controller 95.

Next, the etching gas is stopped, and the wafer is carried out of the reaction chamber 81 (steps S10, S11). Then, it is confirmed that a prescribed number of wafers have been processed. Thus, etching is ended (S12).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A method for etching polycrystalline silicon, comprising:
    holding the polycrystalline silicon at a temperature higher than or equal to $T_E$ (K) given in a following equation; and
    etching the polycrystalline silicon by dry etching with an etching gas containing $CF_4$ and $O_2$, $$T_E = \frac{-0.114x + 0.0556}{k \times \ln\left\{(1 - r/d) \times \frac{-6.27x + 5.38}{-2.01x + 3.11}\right\}}$$

where d (nm) is etching amount of the polycrystalline silicon, r (nm) is surface roughness of the polycrystalline silicon after the etching, x is ratio of flow rate of $CF_4$ gas to sum of flow rate of the $CF_4$ gas and flow rate of $O_2$ gas, and k (eV/K) is Boltzmann constant.

2. The method according to claim 1, wherein the polycrystalline silicon is etched under an isotropic etching condition.

3. The method according to claim 1, wherein
    the polycrystalline silicon is provided on a substrate including a depression, and
    a portion of the polycrystalline silicon is left in the depression, after the polycrystalline silicon provided above the substrate is removed using the dry etching.

4. The method according to claim 3, wherein the depression is a trench or a recess provided on the substrate.

5. The method according to claim 3, wherein an insulating film is provided between the polycrystalline silicon and the substrate.

6. The method according to claim 3, wherein average diameter of a crystal grain in the polycrystalline silicon is comparable to opening width of the depression.

7. The method according to claim 1, wherein the dry etching is carried out using a CDE method.

8. A method for manufacturing a semiconductor device, comprising:
    forming a trench in a semiconductor layer;
    forming an insulating film on an inner surface of the trench;
    forming a polycrystalline silicon layer both on the semiconductor layer and inside the trench; and
    removing the polycrystalline silicon layer above semiconductor layer, leaving a portion of the polycrystalline silicon layer inside the trench,
    the polycrystalline silicon layer being held at a temperature higher than or equal to $T_E$ (K) given in a following equation, and
    the polycrystalline silicon being etched by dry etching with an etching gas containing $CF_4$ and $O_2$, $$T_E = \frac{-0.114x + 0.0556}{k \times \ln\left\{(1 - r/d) \times \frac{-6.27x + 5.38}{-2.01x + 3.11}\right\}}$$

where d (nm) is etching amount of the polycrystalline silicon, r (nm) is surface roughness of the polycrystalline silicon layer after the etching, x is ratio of flow rate of $CF_4$ gas to sum of flow rate of the $CF_4$ gas and flow rate of $O_2$ gas, and k (eV/K) is Boltzmann constant.

9. The method according to claim 8, wherein the polycrystalline silicon is etched under an isotropic etching condition.

10. The method according to claim 8, wherein average diameter of a crystal grain of the polycrystalline silicon is comparable to opening width of the depression.

11. The method according to claim 8, wherein
    the semiconductor layer includes a base region formed in an upper surface thereof, and
    the trench penetrates through the base region to a drift region.

12. The method according to claim 11, wherein
    the polycrystalline silicon layer left inside the trench serves as a gate electrode, and
    the insulating film formed on the inner surface of the trench servers as a gate insulating film.

13. The method according to claim 11, further comprising:
    selectively forming a source region in a surface of the base region;
    selectively forming a contact region adjacent to the source region in a surface of the base region;
    forming an interlayer insulating film on the polycrystalline silicon layer left inside the trench; and
    forming a source electrode in contact with the source region and the contact region, and on the interlayer insulating film.

14. An etching program for etching polycrystalline silicon, comprising:
    setting a stage to a temperature higher than or equal to $T_E$ (K) given in a following equation;
    after mounting a wafer on the stage, detecting the temperature of the stage; and
    etching the wafer if the temperature of the stage is higher than the $T_E$ (K), $$T_E = \frac{-0.114x + 0.0556}{k \times \ln\left\{(1 - r/d) \times \frac{-6.27x + 5.38}{-2.01x + 3.11}\right\}}$$

where d (nm) is etching amount of the polycrystalline silicon, r (nm) is surface roughness of the polycrystalline silicon layer after the etching, x is ratio of flow rate of $CF_4$ gas to sum of flow rate of the $CF_4$ gas and flow rate of $O_2$ gas, and k (eV/K) is Boltzmann constant.

* * * * *